(12) United States Patent
Ricon-Mora

(10) Patent No.: US 6,229,350 B1
(45) Date of Patent: May 8, 2001

(54) ACCURATE, FAST, AND USER PROGRAMMABLE HYSTERETIC COMPARATOR

(75) Inventor: Gabriel Alfonso Ricon-Mora, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/221,471

(22) Filed: Dec. 28, 1998

Related U.S. Application Data

(60) Provisional application No. 60/070,035, filed on Dec. 30, 1997.

(51) Int. Cl.[7] .................................................. H03K 5/22
(52) U.S. Cl. .............................. 327/77; 327/206; 363/41
(58) Field of Search ................................. 327/50, 52, 53, 327/54–56, 63, 65, 66, 67, 71–78, 205, 206, 89; 323/282, 284; 363/39, 41, 74

(56) References Cited

U.S. PATENT DOCUMENTS

| | | |
|---|---|---|
| 5,528,185 * | 6/1996 | Lewicki et al. ..................... 327/206 |
| 5,656,957 * | 8/1997 | Marlow et al. ....................... 327/67 |
| 5,745,352 * | 4/1998 | Sandri et al. ......................... 363/41 |
| 5,917,313 * | 6/1999 | Callahan, Jr. ........................ 323/288 |

* cited by examiner

Primary Examiner—Timothy P. Callahan
Assistant Examiner—Minh Nguyen
(74) Attorney, Agent, or Firm—W. Daniel Swayze, Jr.; Wade James Brady, III; Frederick J. Telecky, Jr.

(57) ABSTRACT

The present invention involves a hysteretic comparator (100) for comparing a sample voltage ($V_{OUT}$) to a reference voltage ($V_{REF}$). A hysteresis voltage generator providing a voltage $V_{HYST-}$ and a voltage $V_{HYST+}$. A first differential input stage (505) generates a signal coupled to a summing node (506, 507) determined from a difference between the sample voltage and $V_{REF}$. A second differential input stage (504) generates a signal coupled to the summing node determined from a positive difference between $V_{HYST-}$ and $V_{HYST+}$. A third differential input stage (503) generates a signal coupled to the summing node determined from a negative difference between $V_{HYST-}$ and $V_{HYST+}$. A control device (512, 513, 514) coupled to selectively enable the second and third differential input stages to select among a first mode and second mode.

15 Claims, 3 Drawing Sheets

ACCURATE, FAST, AND USER PROGRAMMABLE HYSTERETIC COMPARATOR

This application claims priority under 35 USC § 119(e)(1) of provisional application No. 60/070,035 filed Dec. 30, 1997.

A. BACKGROUND OF THE INVENTION

1. Field of the Invention

The present invention relates, in general, to integrated circuits and, more particularly, to integrated circuits having voltage regulator circuits generating an internal power supply voltage from an external power supply voltage.

2. Relevant Background

Integrated circuits (ICs) comprise thousands or millions of individual devices interconnected to provide desired functionality. Significant effort is expended to improve processing techniques so as to reduce the size of each individual device in order to provide greater functionality on a given IC chip at reduced cost. In general, smaller geometry devices operate faster while dissipating less power than do larger geometry devices. As device geometries are reduced the breakdown voltages of the devices and the isolation that separates the devices decreases also.

Electronic systems usually comprise ICs manufactured with a variety of technologies. This has created a need for multiple power supply voltages to be supplied to a single printed circuit board to support the various types of devices on that board. For example, devices are available that require a power supply voltages ranging from 5.0 volts to 3.3 volts, 2.8 volts or lower. A practical solution to this disparity is to provide voltage regulator circuitry that decreases the higher voltage (e.g., 5.0 V in the above example) to the lower voltage required by the small geometry device (e.g., 3.3 V or 2.8 V). Hence, it is necessary to regulate the available power supply voltage to provide voltages consistent with that required by each of the small geometry ICs.

A conventional voltage regulator is designed to generate a lower voltage than the available supply voltage. Typically, a transistor is coupled in series between the external voltage node and the internal voltage supply node. The conductivity of the transistor is modulated to drop the excess voltage across the transistor. Linear regulators have many desirable characteristics such as simplicity, low output ripple, high quality line and load regulation, and fast recovery time. However, linear regulators are inefficient resulting in wasted power and excess heat generation.

Switching regulators are becoming more common because of their characteristic high efficiency and high power density (i.e., power-to-volume ratio) resulting from smaller magnetic, capacitive, and heat sink components. Switching regulators convert one DC voltage into another DC voltage by selectively storing energy by switching energy on and off in an inductor. By comparing the output voltage to a reference voltage the inductor current is controlled to provide the desired output voltage.

Switching regulators exhibit longer hold-up times than linear regulators which is a characteristic that is important in computer applications. Switching regulators accept a wider range of input voltages with little effect on efficiency making them particularly useful in battery powered applications. However, peak-to-peak output voltage ripple of a switching regulator is typically greater than that of linear regulators. Hence, significant development effort is directed at reducing the voltage ripple of switching regulators.

To limit undesirable voltage ripple on the internal voltage supply node, the time constant of the regulator is desirably much longer than the internal cycle of the loading device. This prevents undesired voltage ripple within a cycle that can upset analog voltage levels. One way of controlling ripple is to heavily filter the regulator output by coupling a large capacitor between the internal voltage supply node and ground. In practice, however, filter capacitors consume a great deal of area without adding functionality. Cost and circuit size considerations dictate limiting the filter capacitor to more modest sizes. Hence, it is desirable to minimize voltage ripple in ways that do not require large filter capacitors.

Another technique to effectively increase the time constant of the regulator is to use hysteretic comparators to compare the output voltage to a reference voltage. The hysteretic comparator output drives a switching transistor that controls current in the inductor. However, it is difficult to generate accurate hysteresis as well as provide the ability to program the hysteresis using off-chip components. One prior solution is to use a Schmidtt trigger with an amplifier/comparator having an output and a non-inverting input brought out to pins of the IC. Although this allows the user to program the hysteresis by connecting the external feedback resistor, in many cases, the internal resistor that defines the hysteresis cannot be connected externally because the reference voltage used is not allocated a pin. As a result, the hysteresis is not accurate because the temperature coefficients of the internal and external resistors do not track. Furthermore, the internal and external resistors do not match because they are physically different. Although this limitation can be overcome by bringing the reference voltage out to a pin of the IC, this solution degrades the system's noise performance as well as raises the cost to manufacture the device. Moreover, the load capacitance created by the pins is significant making the design more complex in addition to degrading the overall performance device.

Another solution is to provide a regulator with fixed hysteresis (i.e., all hysteresis determining components are located on chip). Some control could be provided by using a digitally controlled hysteresis network to select the value of the hysteresis determining components. As the selection set increases the number of pins required increases. A user could than select the hysteresis value from among a finite number of choices dictated by the digital input of the hysteresis network. Although this solution yields high speed and accuracy, this comes at a cost of limited user programmability and increased pin allocation. For example, for a two-bit word, requiring two input pins, only four hysteretic settings can be programmed.

B. SUMMARY OF THE INVENTION

The present invention involves a hysteretic comparator for comparing a sample voltage to a reference voltage $V_{REF}$. A hysteresis voltage generator providing a voltage $V_{HYST-}$ and a voltage $V_{HYST+}$. A first differential input stage generates a signal coupled to a summing node determined from a difference between the sample voltage and $V_{REF}$. A second differential input stage generates a signal coupled to the summing node determined from a positive difference between $V_{HYST-}$ and $V_{HYST+}$. A third differential input stage generates a signal coupled to the summing node determined from a negative difference between $V_{HYST-}$ and $V_{HYST+}$. A control device coupled to selectively enable the second and third differential input stages to select among the first mode and second mode.

In another aspect, the present invention involves a method of generating a pulse width modulated signal for driving an output stage of a DC regulator. The DC regulator includes an input stage receiving an input voltage $V_{IN}$ and an output stage providing an output voltage $V_{OUT}$. A reference voltage $V_{REF}$ and a hysteresis voltage $V_{HYST}$ are generated. $V_{OUT}$ to $V_{REF}$ are compared to determine a difference signal. In a first mode, $V_{HYST}$ is added to the difference signal to generate a trigger signal. In a second mode $V_{HYST}$ is subtracted from the difference signal to generate the trigger signal. The pulse width modulated signal is generated by amplifying the trigger signal.

C. BRIEF DESCRIPTION OF THE DRAWINGS

D. DETAILED DESCRIPTION OF THE PREFERRED EMBODIMENTS

The present invention allows the user to program the hysteresis by connecting two external resistors to two pins of the IC. This feature of the present invention enables a great deal of user flexibility in programming hysteresis to meet the needs of a particular application. The use of two pins does not incur any additional cost compared to prior solutions. Moreover, the time sensitive nodes of the hysteretic comparator are buffered from these external pins. In particular, a pulse width modulated signal generated by the present invention $V_{DRIVE}$ need not be coupled to an external I/O pin and so that the signal node will not be loaded with capacitance associated with the external I/O pin.

Figure 1:
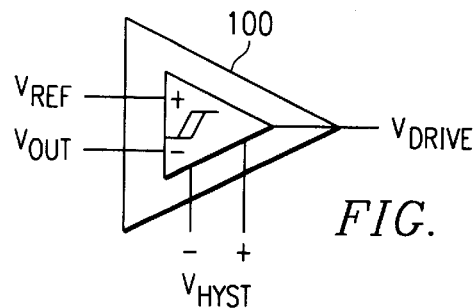
FIG. 1 illustrates a portion of the present invention schematically.

The present invention is illustrated schematically in FIG. 1 as a four-input summing comparator 100. The present invention operates fundamentally as a regulator comprising two distinct regulator elements. A first regulator element is designed to control the average output voltage while a second distinct regulator is designed to control the ripple voltage. The average output voltage is controlled by comparing a reference voltage ($V_{REF}$) to the output voltage ($V_{OUT}$). The ripple regulation is controlled by a $V_{HYST}$ voltage applied to separate input terminals of comparator 100. In this manner each of the regulator elements in comparator 100 is designed to meet the needs of either average DC level control or ripple control. Significantly, because the two regulator elements are formed on a single integrated circuit the component devices are closely parametrically matched to provide superior performance.

Figure 2:
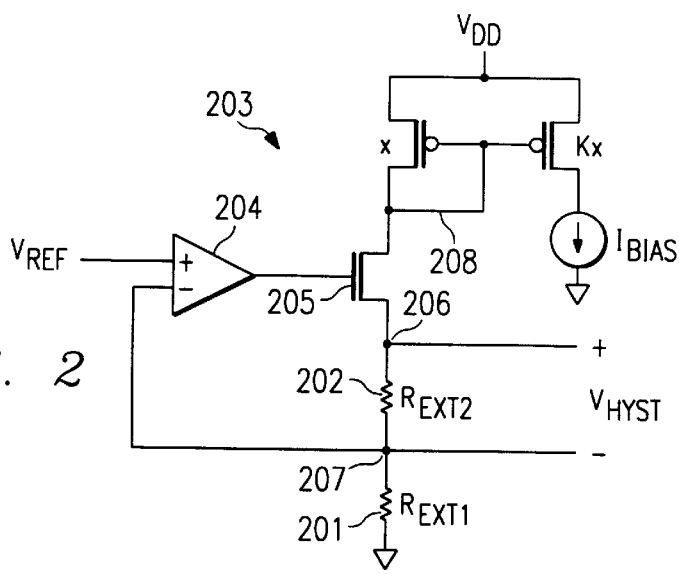
FIG. 2 illustrates an exemplary implementation for generating hysteresis voltages in accordance with the present invention.

FIG. 2 illustrates an exemplary circuit used to generate $V_{HYST}$ from $V_{REF}$. $V_{REF}$ is buffered by amplifier 204 so that $V_{REF}$ is minimally affected by the generation of $V_{HYST}$. The voltage across $R_{EXT2}$ 202 in FIG. 2 defines:

$$V_{HYST} = V_{REF}\left(\frac{R_{EXT2}}{R_{EXT1}}\right)$$

where $V_{HYST}$ determines half the amount of hysteresis exhibited by comparator 100. Reference voltage $V_{REF}$ is generated by a high quality reference such as a bandgap reference thus both $V_{REF}$ and $V_{HYST}$ will be suitably stable. In a particular implementation shown in FIG. 2, a differential amplifier 204 has a non-inverting input coupled to $V_{REF}$ and an inverting input coupled to a first I/O node 207. A switch 205 such as an n-channel MOS transistor has a control input coupled to the output of differential amplifier 204. A resistor $R_{EXT2}$ 202 is coupled between the first and second I/O nodes 207 and 206. A resistor $R_{EXT1}$ 201 is coupled between second I/O node 207 and a ground or common potential. A voltage divider formed by the first and second resistor provide the voltage $V_{HYST+}$ on first I/O node 206 and the voltage $V_{HYST-}$ 207 on second I/O node 207.

Switch 205 supplies a controlled current that can be mirrored to supply a stable bias current $I_{BIAS}$ described by the formula:

$$I_{BIAS} = \left(\frac{V_{REF}}{R_{EXT1}}\right) \times K$$

where K is a constant determined by the size ratios of the transistors in current mirror 203. This feature of the present invention generates a stable $I_{BIAS}$ that can be used by other circuitry and that is user programmable through selection of $R_{EXT1}$ 201 and $R_{EXT2}$ 202. Alternatively node 208 is shorted to the voltage supply $V_{DD}$. The circuit of FIG. 2 generates a single $V_{HYST}$ for a symmetric hysteretic comparator 100. The circuit of FIG. 2 can be readily modified to generate distinct $V_{HYST+}$ and $V_{HYST-}$ to enable asymmetric operation.

Figure 3:
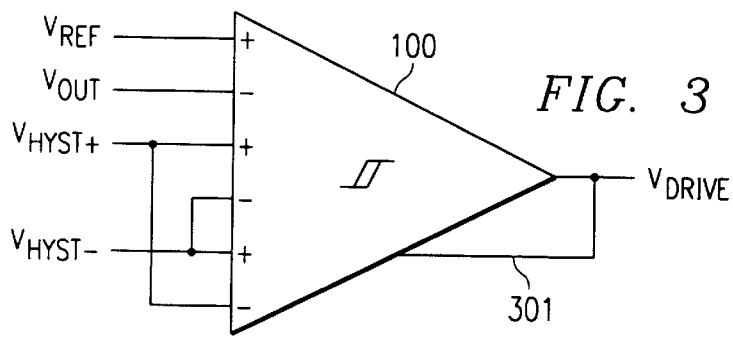
FIG. 3 illustrates an other schematic representation of the hysteretic comparator in accordance with the present invention.

In a preferred implementation, converter 100 is implemented on a monolithic integrated circuit, the first and second I/O nodes 206 and 207 comprise external I/O pins of the integrated circuit. In this embodiment resistors $R_{EXT1}$ and $R_{EXT2}$ are implemented externally with respect to the integrated circuit. A significant advantage in accordance with the present invention is that the hysteresis voltage can be set to any value using two external resistors that can be much more closely matched than could an external and internal resistor pair. However, only two I/O pins are required to generate a wide range of hysteretic voltages. Prior art can only provide four hysteretic settings with two input pins. Using the circuit shown in FIG. 2, $V_{HYST}$ is set independently of the value of $V_{REF}$ and does not load or alter $V_{REF}$. Similarly, the capacitance associated with external I/O pins 206 and 207 is buffered from $V_{REF}$ and so will have minimal impact on performance. As shown in FIG. 1, $V_{HYST+}$, and $V_{HYST-}$ are inputs to a set of terminals of comparator 100. In accordance with the present invention, the polarity of $V_{HYST}$ input terminals is dependent on the comparator output ($V_{DRIVE}$). Referring to FIG. 3, comparator 100 is desirably implemented as a summing comparator comprising three pairs of differential inputs and a binary output. In a first of the differential input pairs the non-inverting (+) input terminal is coupled to $V_{REF}$ and the inverting (−) input is coupled to the actual regulated DC output ($V_{OUT}$). In a second of the differential inputs, the non-inverting (+) input is coupled to the most positive node of $V_{HYST}$ designated $V_{HYST+}$, for ease of understanding. In the second differential pair, the inverting (−) input is coupled to the most negative node of $V_{HYST}$ designated $V_{HYST-}$ herein. In the third differential input pair, the $V_{HYST}$ couplings are reversed such that the non-inverting (+) input is coupled to $V_{HYST-}$. and the inverting (−) node is coupled to $V_{HYST+}$.

In accordance with the present invention, comparator 100 is internally coupled to operate in a selected one of at least two operating modes. In a first mode, output $V_{DRIVE}$ is a binary function of the sum of the difference voltages of the first and second pairs of differential inputs. In this first mode, the third pair of differential inputs is essentially disabled. In a second mode, the output $V_{DRIVE}$ is a binary function of the sum of the difference voltages of the first and third pairs of differential inputs with the second pair of differential inputs essentially disabled. The operation mode of comparator 100 is selected by the state of $V_{DRIVE}$ as coupled back to comparator 100 on feedback line 301.

Figure 4:
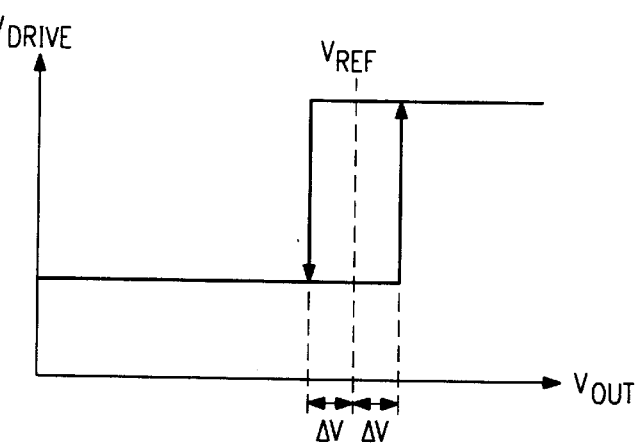
FIG. 4 shows a voltage diagram illustrating switching behavior of a hysteretic comparator in accordance with the present invention.

The voltage at which the binary output of comparator 100 switches is referred to as the "trip-point". The trip-point is centered at $V_{REF}$ as shown in FIG. 4. In accordance with the present invention, the trip-point of comparator 100 is offset from $V_{REF}$ by an amount $\Delta V$ equal to $V_{HYST}$ when $V_{OUTPUT}$ is ramping up from a low state and offset from $V_{REF}$ by an amount $\Delta V$ equal to $V_{HYST}$ when $V_{OUTPUT}$ is ramping down from a high state. The trip-point offset $\Delta V$ is substantially equal (in both directions) to $V_{HYST}$ when the input pairs in comparator 100 are matched. Alternatively, $V_{HYST+}$ and $V_{HYST-}$ can be set separately for asymmetrical hysteresis operation as described hereinbefore. The benefits of the present invention are greatly exploited in hysteretic DC-DC converters where the accuracy and speed of the comparator are paramount.

Figure 5:
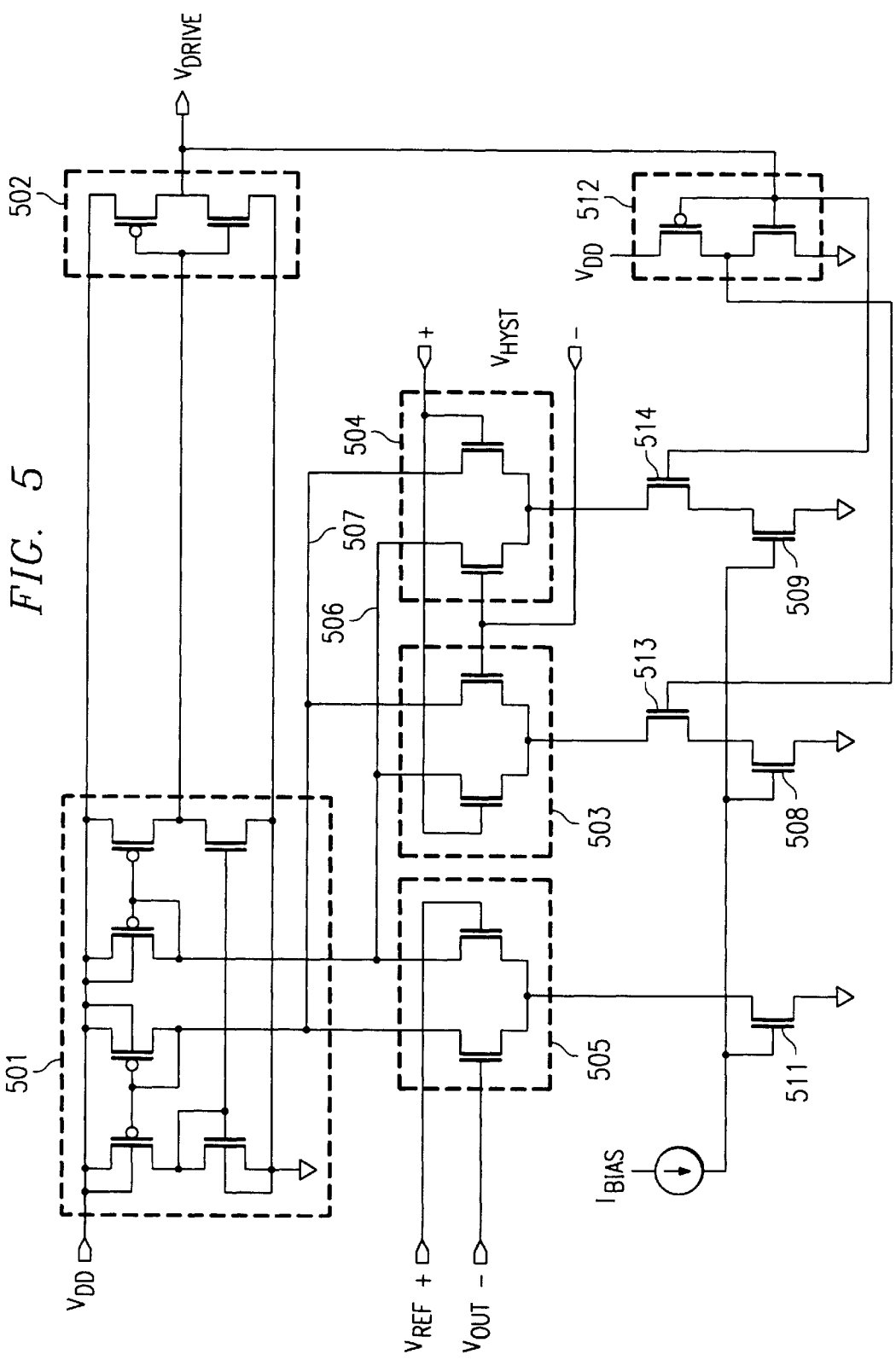
FIG. 5 illustrates an exemplary CMOS implementation in accordance with the present invention.
Figure 6:
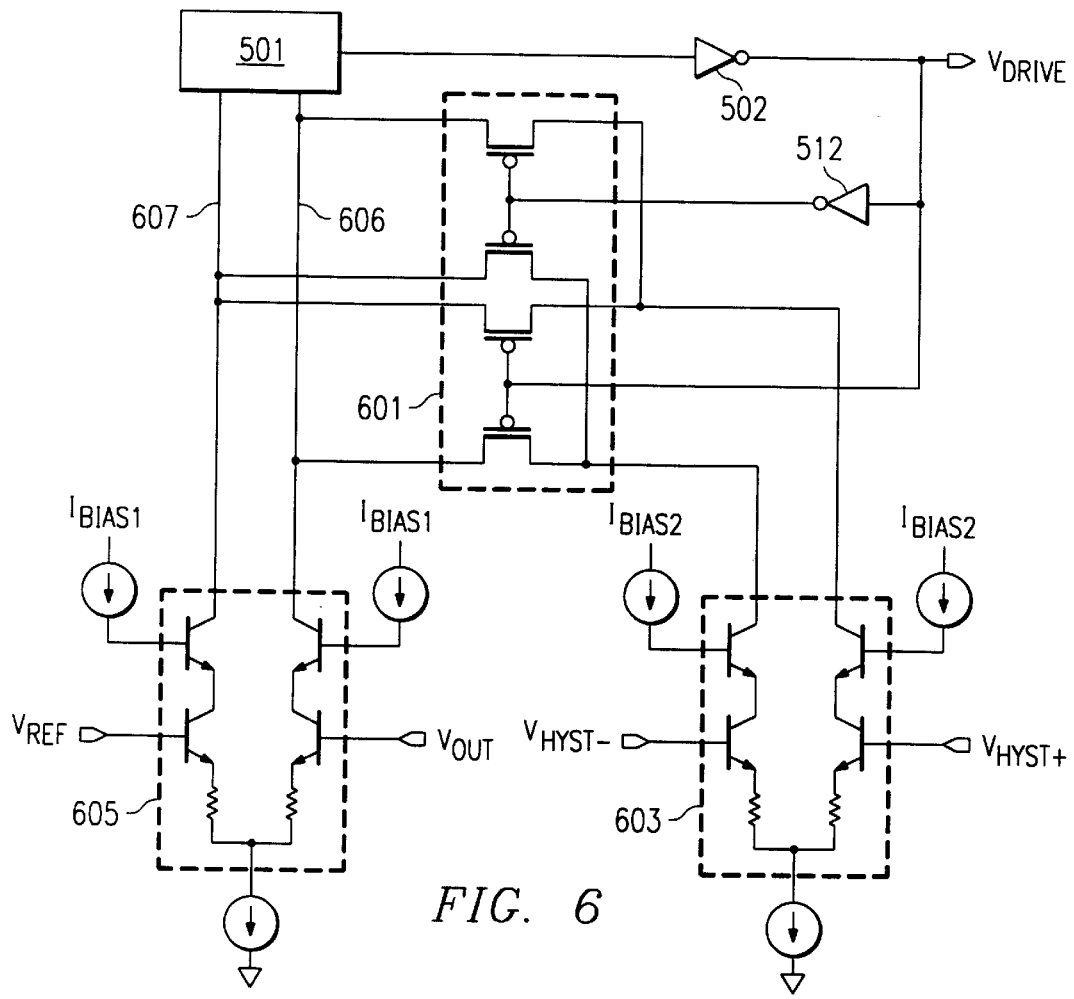
FIG. 6 illustrates a portion of an alternative embodiment including a BiCMOS implementation in accordance with the present invention.
Figure 7:
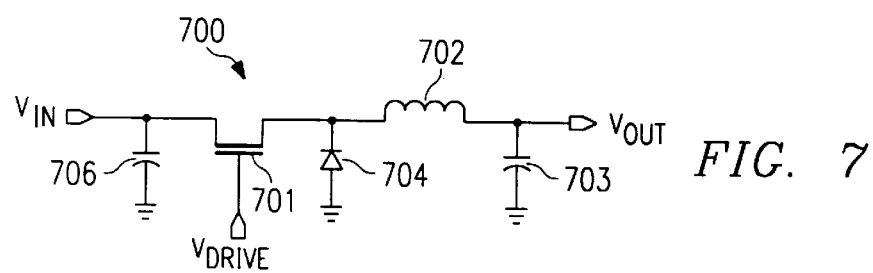
FIG. 7 shows an example output stage useful in combination with a hysteretic comparator of FIG. 4.

FIG. 5 through FIG. 7 show specific CMOS implementations of the present invention. It should be understood that the implementations shown in FIG. 5–FIG. 7 are provided for example only and that the present invention may be implemented in other technologies including bipolar and BiCMOS technologies, and may use circuits having a greater or lesser number of components to realize the functionality described herein. Accordingly, these other implementations are equivalent to the specific implementations described herein.

Comparator block 501 comprises a CMOS comparator accepting a DC input voltage such as $V_{DD}$ that is different from the desired output voltage $V_{OUT}$. $V_{DD}$ is typically a regulated voltage and may be higher or lower than $V_{OUT}$ although it is higher than $V_{OUT}$ in the particular example herein. The trip-point of comparator 501 is set by the signal (i.e., voltage and/or current) on nodes 506 and 507 as set by input differential pairs 503, 504, and 505. Transistors 508, 509, and 511 serve as matched current sources for each of input differential pairs 503, 504 and 505 respectively. Output buffer 502 is implemented as a CMOS buffer having an inverting output stage comprising transistors sized to adequately drive the $V_{DRIVE}$ signal.

Output buffer 502 is switched by the output of the comparator block 501. Output buffer 502 generates the $V_{DRIVE}$ signal that is coupled back to inverter 512 and mode control switch 514. The output of inverter 512 is coupled to mode control switch 513. Mode control switches 513 and 514 in cooperation with inverter 512 selectively enable one or the other of input pairs 503 and 504 based upon the current binary value of $V_{DRIVE}$.

Input pair 505 accepts the $V_{REF}$ signal on its non-inverting (+) input and the $V_{OUT}$ signal on its inverting input. A first output of input pair 505 is coupled to summing node 506 whereas a second output of input pair 505 is coupled to summing node 507. Input pair 503 accepts the $V_{HYST+}$ signal on its inverting input and the $V_{HYST-}$ signal on its non-inverting input. Input pair 504 accepts the $V_{HYST-}$ signal on its inverting input and the $V_{HYST+}$ signal on its non-inverting input.

In operation, the $V_{DRIVE}$ signal selectively enables one or the other of input pairs 503 and 504. In the example shown in FIG. 5, a logic HIGH on the $V_{DRIVE}$ line enables switch 514 and disables switch 513. In this first mode, input pair 513 is disabled and does not affect the voltage on summing nodes 506 and 507. In the first mode $V_{HYST}$ is added to $V_{REF}$ to set the trip-point of comparator unit 501. In contrast, a logic LOW on the $V_{DRIVE}$ line enables switch 513 and disables switch 514. In this second mode, input pair 514 is disabled and does not affect the voltage on summing nodes 506 and 507. In the second mode $V_{HYST}$ is subtracted from $V_{REF}$ to set the trip-point of comparator unit 501.

FIG. 6 shows a portion of an alternative embodiment illustrating two alternative features in accordance with the present invention. The circuit of FIG. 6 illustrates a bipolar-CMOS (BiCMOS) implementation including both bipolar and CMOS components. The circuit shown in FIG. 6 performs essentially the same functions as the circuit shown in FIG. 5. However, input differential amplifiers 603 and 605 are implemented using bipolar NPN transistors which offer faster switching characteristics than the MOS implementation of FIG. 5. Details of biasing differential pairs 603 and 605 are not significant for the understanding of the present invention and so are not shown to ease illustration and understanding. Any available biasing technique may be used to supply $I_{BIAS1}$ and $I_{BIAS2}$.

One feature of the implementation of FIG. 6 is that a single differential input pair 603 in combination with current steering unit 601 provides the functionality of the two differential input pairs 503 and 504 in the earlier embodiment. Current steering unit 601 comprises a plurality of switches controlled by the $V_{DRIVE}$ signal. Conveniently, an inverted $V_{DRIVE}$ is also used to simplify switching. The difference signal(s) from differential input pair 603 is selectively coupled to summing nodes 606 and 607 to cause the hysteresis signal to be added to or subtracted from the difference signal produced by differential input 605. Summing nodes 606 and 607 can be coupled to provide the summed signal to comparator 501 which drives output stage 501 in a manner similar to that described in reference to FIG. 5.

It should be understood that the use of a current steering unit 601 is equally useful in pure bipolar and pure CMOS implementations, and that the BiCMOS implementation of FIG. 6 is provided for example only. BiCMOS implementations offer certain performance advantages by including high speed bipolar components with low power MOS components, however, add fabrication complexity and cost that may be undesirable in some applications. The alternative shown in FIG. 6 allows one input differential pair to be eliminated with the addition of current steering unit 601 and may result in area savings and simpler circuit design in some implementations. More significantly, because differential input 603 is always on it does not experience the delays and/or power loss associated with switching. In contrast, differential input pairs 503 and 504 in FIG. 5 are switched on and off and may exhibit higher latency.

Figure 8:
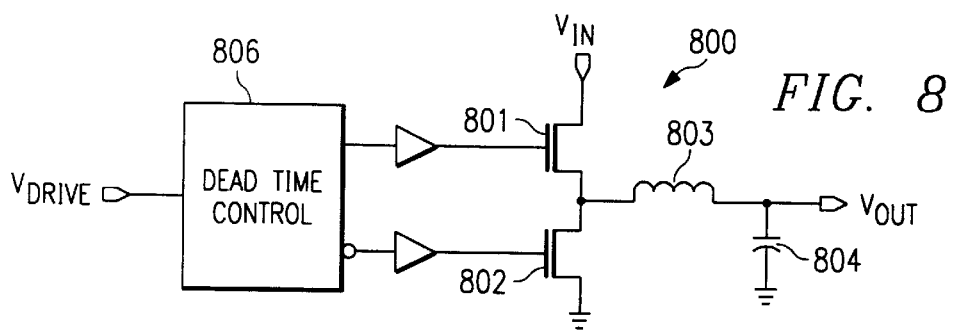
FIG. 8 shows an alternative output stage useful in combination with a hysteretic comparator of FIG. 4.

FIG. 7 and FIG. 8 illustrate exemplary circuits 700 and 800 for receiving the $V_{DRIVE}$ signal and generating a regulated DC output voltage $V_{OUT}$. The example of FIG. 7 shows a basic buck regulator output stage in which $V_{DRIVE}$ drives a switch 701 implemented as an n-channel MOSFET. The buck regulator of FIG. 7 is used to step an input voltage $V_{IN}$ down to a lower level. Switch 701 chops the input DC voltage $V_{IN}$ into a square wave. This square wave is then converted back into a DC voltage of lower magnitude by the low pass filter comprising inductor 702 and capacitor 703. Diode 704 shunts excess voltage to ground while capacitor 706 serves as a preliminary filter to smooth variations in $V_{IN}$. The duty cycle of the square wave relates the output voltage to the input voltage by the equation:

$$V_{OUT} = V_{IN} \times \frac{t_{on}}{t_{on} + t_{off}}$$

where $t_{on}$ and $t_{off}$ describe the duty cycle of $V_{DRIVE}$.

FIG. 8 shows a synchronous buck power stage used to efficiently convert the input voltage $V_{IN}$ down to a lower DC voltage $V_{OUT}$. In this implementation transistors 801 and 702 receive independent drive signals from dead time control circuit 806 based upon $V_{DRIVE}$. Switches 801 and 802 chops the input DC voltage $V_{IN}$ into a square wave. This square wave is then converted into a DC voltage of lower magnitude by a low pass filter comprising inductor 803 and capacitor 804.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A hysteretic comparator for comparing a sample voltage comprising:
    a reference voltage generator providing a voltage $V_{REF}$;
    a hysteresis voltage generator providing a voltage $V_{HYST-}$ and a voltage $V_{HYST+}$;
    a first differential input stage generating a signal coupled to a summing node determined from a difference between the sample voltage and $V_{REF}$;
    a second differential input stage generating a signal coupled to the summing node determined from a positive difference between $V_{HYST-}$ and $V_{HYST+}$;
    a third differential input stage generating a signal coupled to the summing node determined from a negative difference between $V_{HYST-}$ and $V_{HYST+}$;
    a control device coupled to selectively enable the second and third differential input stages to select among a first mode and a second mode wherein the hysteresis voltage generator derives $V_{HYST-}$ and the voltage $V_{HYST+}$ from $V_{REF}$.

2. A hysteretic comparator for comparing a sample voltage comprising:
    a reference voltage generator providing a voltage $V_{REF}$;
    a hysteresis voltage generator providing a voltage $V_{HYST-}$ and a voltage $V_{HYST+}$;
    a first differential input stage generating a signal coupled to a summing node determined from a difference between the sample voltage and $V_{REF}$;
    a second differential input stage generating a signal coupled to the summing node determined from a positive difference between $V_{HYST-}$ and $V_{HYST+}$;
    a third differential input stage generating a signal coupled to the summing node determined from a negative difference between $V_{HYST-}$ and $V_{HYST+}$;
    a control device coupled to selectively enable the second and third differential input stages to select among a first mode and a second mode, wherein the hysteresis voltage generator further comprises:
        a differential amplifier having a non-inverting input coupled to $V_{REF}$ and an inverting input coupled to a first I/O node, and an output;
        a switch having a control input coupled to the differential amplifier output, the switch supplying a controlled current to a second I/O node;
        a first resistor coupled between the first and second I/O nodes;
        a second resistor coupled between the second I/O node and a ground potential; and
        wherein a voltage divider formed by the first and second resistor provide the voltage $V_{HYST+}$ on the first I/O node and the voltage $V_{HYST-}$ on the second I/O node.

3. The hysteretic comparator of claim 2 wherein the hysteretic voltage generator is implemented on a monolithic integrated circuit, the first and second I/O nodes comprise external I/O pins of the integrated circuit, and the first and second resistors are implemented externally with respect to the integrated circuit.

4. A hysteretic comparator for comparing a sample voltage comprising:
    a reference voltage generator providing a voltage $V_{REF}$;
    a hysteresis voltage generator providing a voltage $V_{HYST-}$ and a voltage $V_{HYST+}$;
    a first differential input stage generating a signal coupled to a summing node determined from a difference between the sample voltage and $V_{REF}$;
    a second differential input stage generating a signal coupled to the summing node determined from a positive difference between $V_{HYST-}$ and $V_{HYST+}$;
    a third differential input stage generating a signal coupled to the summing node determined from a negative difference between $V_{HYST-}$ and $V_{HYST+}$;
    a control device coupled to selectively enable the second and third differential input stages to select among a first mode and a second mode, wherein the control device further comprises:
        an inverter coupled to receive a $V_{DRIVE}$ signal and generate an inverted $V_{DRIVE}$ signal;
        a first switch coupled to controllably interrupt current in the second input stage, the first switch under control of the $V_{DRIVE}$ signal; and
        a second switch coupled to controllably interrupt current in the third input stage, the second switch under control of the inverted $V_{DRIVE}$ signal.

5. The hysteretic comparator of claim 4 wherein the first, second, and third input stages each have a non-inverting output and an inverting output, and the hysteretic comparator further comprises:
    a first summing node coupled to the non-inverting output of the first input stage, the non-inverting output of the second input stage, and the inverting output of the third input stage; and
    a second summing node coupled to the inverting output of the first input stage, the inverting output of the second input stage, and the non-inverting output of the third input stage.

6. A method of generating a pulse width modulated signal for driving an output stage of a regulator, the regulator including an input stage receiving an input voltage $V_{IN}$ and an output stage providing an output voltage $V_{OUT}$, the method comprising the steps of:

generating a reference voltage $V_{REF}$;

generating a hysteresis voltage $V_{HYST}$;

comparing $V_{OUT}$ to $V_{REF}$ to determine a difference signal;

in a first mode, adding $V_{HYST}$ to the difference signal to generate a trigger signal;

in a second mode, subtracting $V_{HYST}$ from the difference signal to generate the trigger signal; and generating the pulse width modulated signal by amplifying the trigger signal further comprising the steps of:
chopping the input voltage $V_{IN}$ into a square wave using the pulse width modulated signal; and
converting the square wave into the voltage $V_{OUT}$ using a low pass filter.

7. A DC-DC converter comprising:

an input node receiving an input voltage $V_{IN}$;

a pulse width modulation (PWM) unit coupled to chop $V_{IN}$ into a square wave under control of a $V_{DRIVE}$ signal;

an output stage converting the chopped $V_{IN}$ to an output voltage $V_{OUT}$ (coupled to an output node);

a reference voltage generator providing a voltage $V_{REF}$;

a hysteresis voltage generator providing a voltage $V_{HYST-}$ and a voltage $V_{HYST+}$; and a hysteretic comparator unit coupled to receive $V_{OUT}$, $V_{REF}$, $V_{HYST-}$ and $V_{HYST+}$, and coupled to the PWM unit to provide the $V_{DRIVE}$ signal, the hysteretic comparator having a first mode and a second mode selected by the $V_{DRIVE}$ signal.

8. The DC-DC converter of claim 7 wherein the hysteretic comparator further comprises:

a first differential input stage generating a signal coupled to a summing node determined from a difference between $V_{OUT}$ and $V_{REF}$;

a second differential input stage generating a signal coupled to the summing node determined from a positive difference between $V_{HYST-}$ and $V_{HYST+}$;

a third differential input stage generating a signal coupled to the summing node determined from a negative difference between $V_{HYST-}$ and $V_{HYST+}$; and a control device coupled to selectively enable the second and third differential input stages to select among the first mode and second mode.

9. The DC-DC converter of claim 2 wherein the first second and third input stages each have a non-inverting output and an inverting output, and the summing node further comprises:

a first summing node coupled to the non-inverting output of the first input stage, the non-inverting output of the second input stage, and the inverting output of the third input stage; and a second summing node coupled to the inverting output of the first input stage, the inverting output of the second input stage, and the non-inverting output of the third input stage.

10. The DC-DC converter of claim 8 wherein the control device further comprises:

an inverter coupled to receive the $V_{DRIVE}$ signal and generate an inverted $V_{DRIVE}$ signal;

a first switch coupled to controllably interrupt current in the second input stage, the first switch under control of the $V_{DRIVE}$ signal; and a second switch coupled to controllably interrupt current in the third input stage, the second switch under control of the inverted $V_{DRIVE}$ signal.

11. The DC-DC converter of claim 8 further comprising:

first, second, and third matched current sources regulating current in each of the first, second, and third input stages respectively.

12. The DC-DC converter of claim 9 wherein the hysteretic comparator further comprises:

a fourth differential comparator generating a binary signal from a difference between the first and second summing nodes; and an output driver coupled to receive the binary signal from the fourth differential comparator and generate the $V_{DRIVE}$ signal.

13. The DC-DC converter of claim 7 wherein the hysteretic comparator further comprises:

a first differential input stage generating a signal coupled to a summing node determined from a difference between $V_{OUT}$ and $V_{REF}$;

a second differential input stage generating a signal determined from a difference between $V_{HYST-}$ and $V_{HYST+}$;

a current steering unit coupled to add the signal from the second differential input stage to the summing node in the first mode and subtract the signal from the second differential input stage from the summoning node in the second mode; and a control device coupled to the current steering unit to select among the first mode and second mode.

14. The DC-DC converter of claim 7 wherein the hysteresis voltage generator further comprises:

a differential amplifier having a non-inverting input coupled to $V_{REF}$ and an inverting input coupled to a first I/O node, and an output;

a switch having a control input coupled to the differential amplifier output, the switch supplying a controlled current to a second I/O node;

a first resistor coupled between the first and second I/O nodes;

a second resistor coupled between the second I/O node and a ground potential; and wherein a voltage divider formed by the first and second resistor provide the voltage $V_{HYST+}$ on the first I/O node and the voltage $V_{HYST-}$ on the second I/O node.

15. The DC-DC converter of claim 14 wherein the converter is implemented on a monolithic integrated circuit, the first and second I/O nodes comprise external I/O pins of the integrated circuit, and the first and second resistors are implemented externally with respect to the integrated circuit.

* * * * *

UNITED STATES PATENT AND TRADEMARK OFFICE
CERTIFICATE OF CORRECTION

PATENT NO. : 6,229,350 B1
DATED : May 8, 2001
INVENTOR(S) : Gabriel A. Rincon-Mora It is certified that error appears in the above-identified patent and that said Letters Patent is hereby corrected as shown below:

<u>Title page,</u>
Item [75], change Ricon-Mora to -- Rincon-Mora --

Signed and Sealed this

Twenty-ninth Day of January, 2002

Attest:

Attesting Officer

JAMES E. ROGAN
Director of the United States Patent and Trademark Office